(12) United States Patent
Huang

(10) Patent No.: US 10,651,815 B1
(45) Date of Patent: May 12, 2020

(54) COMPACT WIDE BANDWIDTH PASSIVE PHASE SHIFTER FOR RADIO FREQUENCY AND MICROWAVE APPLICATIONS

(71) Applicant: United States of America as represented by the Administrator of NASA, Washington, DC (US)

(72) Inventor: Wei-Chung Huang, College Park, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 28 days.

(21) Appl. No.: 16/014,105

(22) Filed: Jun. 21, 2018

(51) Int. Cl.
*H01P 1/18* (2006.01)
*H03H 7/18* (2006.01)
*H03H 7/21* (2006.01)
*H01Q 3/36* (2006.01)

(52) U.S. Cl.
CPC ............. *H03H 7/21* (2013.01); *H01P 1/184* (2013.01); *H01Q 3/36* (2013.01); *H03H 7/185* (2013.01)

(58) Field of Classification Search
CPC .... H03H 7/18; H03H 7/21; H01P 1/18; H01P 1/184
USPC .................................................. 333/138, 161
See application file for complete search history.

(56) References Cited

U.S. PATENT DOCUMENTS

| | | | | |
|---|---|---|---|---|
| 5,109,205 A * | 4/1992 | Hart | ......................... | H01P 1/15 333/104 |
| 5,307,033 A * | 4/1994 | Koscica | .................. | H01P 1/181 333/161 |
| 6,275,120 B1 * | 8/2001 | Vaninetti | ................. | H01P 1/184 333/161 |
| 7,692,516 B2 * | 4/2010 | Kim | ...................... | H01P 1/2005 333/138 |

OTHER PUBLICATIONS

Zheng et al., Broadband Phase Shifter Using Loaded Transmission Line, Sep. 2010, IEEE, vol. 20 No. 9, 3 pages.*
Yeung et al., Broadband 90 degree Differential Phase Shifter Constructed Using a Pair of Multisection Radial Line Stubs, Sep. 2012, IEEE, vol. 60 No. 9, 8 pages.*
Liu et al., Novel Wideband Single-Layer 90 degree Phase Shifter Based on Radial-Stub and Weak Coupled Line, 2016, Journal of Circuits, Systems, and Computers, vol. 25, No. 12, 8 pages.*
Xu et al., Compact UWB Bandpass Filter With a Notched Band Using Radial Stub Loaded Resonator, Jul. 2012, IEEE, vol. 22, No. 7, 3 pages.*
Coimbra, A New Kind of Radial Stub and Some Applications, IEEE, 2007, 7 pages (cover page and 516-521).*

* cited by examiner

*Primary Examiner* — Dean O Takaoka
(74) *Attorney, Agent, or Firm* — Christopher O. Edwards; Bryan A. Geurts

(57) ABSTRACT

A passive phase shifter includes a reference line and a half-wavelength transmission line, where the half-wavelength transmission line is loaded with a perpendicular quarter wavelength rectangular stub and a quarter wavelength radial stub structure connected in series.

15 Claims, 5 Drawing Sheets

COMPACT WIDE BANDWIDTH PASSIVE PHASE SHIFTER FOR RADIO FREQUENCY AND MICROWAVE APPLICATIONS

INVENTION BY GOVERNMENT EMPLOYEE(S) ONLY

The invention described herein was made by one or more employees of the United States Government, and may be manufactured and used by or for the Government for governmental purposes without the payment of any royalties thereon or therefor.

BACKGROUND

The disclosed embodiments generally relate to a phase shifter design, and in particular, to a passive phase shifter with a wide bandwidth that can be used in both radio frequency and microwave applications.

In this technology age of more reliable and faster data speeds, the accompanying hardware needs to accommodate the higher data rates with higher bandwidth performance. One such component of the hardware is the phase shifter. Phase shifters have multiple applications, for example, in linearization, amplification, power mixing, power dividing, power coupling, metrology, and instrumentation, and in particular, in phase modulation communication systems and phased array antenna systems.

A classic phase shifter is the Schiffman phase shifter, as described in B. Schiffman, "A new class of broadband microwave 90-degree phase shifters," *IRE Transactions on Microwave Theory & Techniques*, vol. MTT-6, no. 4, pp. 232-237, April 1958, which employs sections of coupled-strip transmission lines to create phase shift elements. Even with improvements made to the Schiffman phase shifter designs, such as those described in J. L. R. Quirarte and J. P. Starski, "Novel Schiffman phase shifters," IEEE Transactions on Microwave Theory & Techniques, vol. 41, no. 1, pp. 9-14, January 1993, and those described in Y. Guo, Z. Zhang, and L. Ong, "Improved wideband Schiffman phase shifter," IEEE Transactions on Microwave Theory & Techniques, vol. 54, no. 3, pp. 1196-1200, March 2006, the implementations hinge on extremely tight coupling, narrow microstrip lines, and very narrow coupling gaps, for wide bandwidth performance. For operation around 13 GHz, the dimensions of the narrow microstrip lines and coupling gaps disclosed in the previous publications require specific fabrication techniques that are not realizable with more prevalent and less expensive printed circuit board fabrication technology.

Other techniques, such as those described in A. M. Abbosh, "Ultra-wideband phase shifters," IEEE *IEEE Transactions on Microwave Theory & Techniques*, vol. 55, no. 9, pp. 1935-1941, September 2007, M. Naser-Moghadasi, G. R. Dadashzadeh, A. Dadgarpour, F. Jolani, and B. S. Virdee, "Compact ultra wideband phase shifter," *Progress In Electromagnetics Research Letters*, vol. 15, pp. 89-98, 2010, and M. A. Honarvar, F. Jolani, A. Dadgarpour, and B. S. Virdee, "Compact wideband phase shifter," *International Journal of RF and Microwave Computer-Aided Engineering*, vol. 23, no. 1, pp. 47-51, January 2013, exploit broadside coupling among layers of microstrip patches and slots. However, these techniques add a layer of complexity with fabrication of additional layers and are not practical when integrating the phase shifter with other microwave components.

A broadband approach using a loaded transmission line concept is proposed in S. Y. Zheng, W. S. Chan, and K. F. Man, "Broadband phase shifter using loaded transmission line," *IEEE Microwave and Wireless Components Letters*, vol. 20, no. 9, pp. 498-500, September 2010. As shown in FIG. 1, a half wavelength transmission line 105 was loaded in the middle with a half wavelength open stub 110. For additional bandwidth and compactness, a T-shaped stepped impedance half wavelength stub 205 was designed as shown in FIG. 2. The T shaped half wavelength stub 205 is implemented as a quarter wavelength stub terminated by quarter wavelength triangular patches. The phase characteristics are mainly determined by the length of the open stub and the triangular patches. Microstrip widths $w_1$ and $w_2$, and length $l_2$ are chosen for impedance matching. The phase characteristics of both the half wavelength open stub 110 and the T shaped half wavelength stub 205 with the same characteristic impedance are shown in FIG. 3. However, the sharply acute angles of this design are difficult to manufacture, this approach is not easy to replicate for other operating frequencies, and the amount of phase ripple leaves room for improvement.

FIG. 4 shows a design as described in S. H. Yeung, Q. Xue, and K. F. Man, "Broadband 90° differential phase shifter constructed using a pair of multisection radial line stubs," IEEE Transactions on Microwave Theory & Techniques, vol. 60, no. 9, pp. 2760-2767, September 2012. The implementation illustrated in FIG. 4 has a pair of multisectional radial open stubs 405, 410 that provide a 10% improvement in bandwidth and 1.4 degree improvement in phase error over the design shown in FIG. 2. However, this 10% improvement in bandwidth and 1.4 degrees of phase error costs four times more in real estate than the solution shown in FIG. 2, and while this design achieves an improvement over the design shown in FIG. 2 in terms of bandwidth and phase ripple, it is overly complex with multiple radial stublike sections.

Phase shifter designs may be realized using microstrip implementations, that is, by forming conductor shapes on a substrate. Typical conductor materials may include elemental metals such as aluminum, copper, gold, and silver, while typical substrate materials may include alumina, gallium arsenide, glass reinforced epoxy laminate, and quartz. The impedance of a microstrip line $Z_0$ may be determined from its width and thickness, and the characteristics of the substrate. An exemplary equation is presented below for calculating the impedance of a microstrip line $Z_0$ when the ratio of microstrip width, shown in this example as W, to substrate thickness, shown in this example as H, is less than 1. Another exemplary equation is shown when the ratio of microstrip width W, to substrate thickness H, is greater than or equal to 1:

$$\text{when } \left(\frac{W}{H}\right) < 1$$

$$\varepsilon_e = \frac{\varepsilon_r + 1}{2} + \frac{\varepsilon_r - 1}{2}\left[\left(1 + 12\left(\frac{H}{W}\right)\right)^{-1/2} + 0.04\left(1 - \left(\frac{W}{H}\right)\right)^2\right]$$

$$Z_0 = \frac{60}{\sqrt{\varepsilon_{\text{eff}}}} \ln\left(8\frac{H}{W} + 0.25\frac{W}{H}\right) (\text{ohms})$$

$$\text{when } \left(\frac{W}{H}\right) \geq 1$$

$$\varepsilon_e = \frac{\varepsilon_r + 1}{2} + \frac{\varepsilon_r - 1}{2}\left(1 + 12\left(\frac{H}{W}\right)\right)^{-1/2}$$

$$Z_0 = \frac{120\pi}{\sqrt{\varepsilon_{\mathit{eff}}} \times \left[\frac{W}{H} + 1.393 + \frac{2}{3}\ln\left(\frac{W}{H} + 1.444\right)\right]}$$

where $\varepsilon_r$ is defined as the relative dielectric constant of the substrate;

$\varepsilon_e$ is the effective dielectric constant of the substrate;

H is the height of the substrate; and

W equals the width of the microstrip, where it is assumed that the thickness of the microstrip t is thin enough to be ignored.

For designs based on achieving a particular impedance, the width of the microstrip may be determined from the impedance according to the following equation:

$$w = \frac{7.48 \times h}{e^{\left(Z_0 \frac{\sqrt{\varepsilon_r + 1.41}}{87}\right)}} - 1.25 \times t$$

where $\varepsilon_r$ is defined as the relative dielectric constant of the substrate;

h is the height of the substrate;

w equals the width of the microstrip; and t is the thickness of the microstrip.

SUMMARY

It would be advantageous to provide a phase shifter suitable for use in high data rate, subharmonic mixer applications, with a wide bandwidth centered at one-half of the output frequency, with 45 degrees phase shift and very little phase ripple in band. Additional advantages include good return loss and low insertion loss performance, and a compact fit in a 150 mils, or 3.81 mm channel to avoid the propagation of higher-order modes.

The disclosed embodiments are directed to a passive phase shifter, including a reference line, and a half-wavelength transmission line loaded with a quarter wavelength rectangular stub and a quarter wavelength radial stub structure connected in series.

The quarter wavelength rectangular stub may be connected between the half wavelength transmission line and the quarter wavelength radial stub structure.

The quarter wavelength radial stub structure may include linear sides that define a first angle.

The quarter wavelength radial stub structure may include radial stub elements arranged on opposing sides of the perpendicular quarter wavelength rectangular stub.

The radial stub elements may have centerlines extending parallel to the half-wavelength transmission line.

The radial stub elements may include linear sides that define a second angle.

The radial stub elements may have centerlines that form opposite congruent acute third angles with a centerline of the transmission line.

The radial stub elements may include linear sides that define a fourth angle.

The quarter wavelength radial stub structure may include hexagonal radial stub elements arranged on opposing sides of the perpendicular quarter wavelength rectangular stub.

The hexagonal radial stub elements arranged on opposing sides of the perpendicular quarter wavelength rectangular stub may have height dimensions extending perpendicular to a length of the half-wavelength transmission line.

The hexagonal radial stub elements may include isosceles frusto-triangular structures with bases centered on rectangular shaped structures.

Apexes of the frusto-triangular structures may terminate in flat surfaces parallel to a length of the half-wavelength transmission line.

The quarter wavelength radial stub structure may include pentagonal radial stub elements arranged on opposing sides of the perpendicular quarter wavelength rectangular stub.

The pentagonal radial stub elements may have centerlines that form opposite congruent acute fifth angles with a centerline of the transmission line.

The pentagonal radial stub elements may include linear sides that define a sixth angle.

The pentagonal radial stub elements may include isosceles triangular shaped structures with bases centered on rectangular shaped structures.

BRIEF DESCRIPTION OF THE DRAWINGS

The foregoing aspects and other features of the embodiments are explained in the following description, taken in connection with the accompanying drawings, wherein.

DETAILED DESCRIPTION

Figure 1:
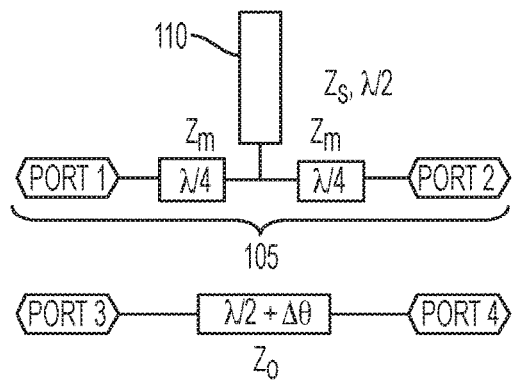
FIGS. 1-4 illustrate examples of prior art loaded transmission line phase shifters.

Although the disclosed embodiments will be described with reference to the embodiments shown in the drawings and described below, it should be understood that these could be embodied in many alternate forms. In addition, any suitable size, shape or type of elements or materials could be used.

As mentioned above, the disclosed embodiments are directed to a passive phase shifter, including reference line, and a half-wavelength transmission line loaded with a quarter wavelength rectangular stub in series with a quarter wavelength radial stub. Using the same naming convention as shown in FIG. 1, the three characteristic impedances associated with the embodiments disclosed herein are Zo, Zm, and Zs, where Zo is the characteristic impedance of the reference line and is nominally set to 50 ohms for each of the disclosed embodiments, Zm is the characteristic impedance of the half-wavelength transmission line, and Zs is the characteristic impedance of the combination rectangular and radial stub line. The ratio of Zs to Zm controls the phase variation and bandwidth can be traded for less variation in phase response. The disclosed embodiments provide a phase shift that may vary by only a few degrees per octave. The values of Zs and Zm are also tuned to improve the insertion and return loss of the phase shifter.

Figure 5:
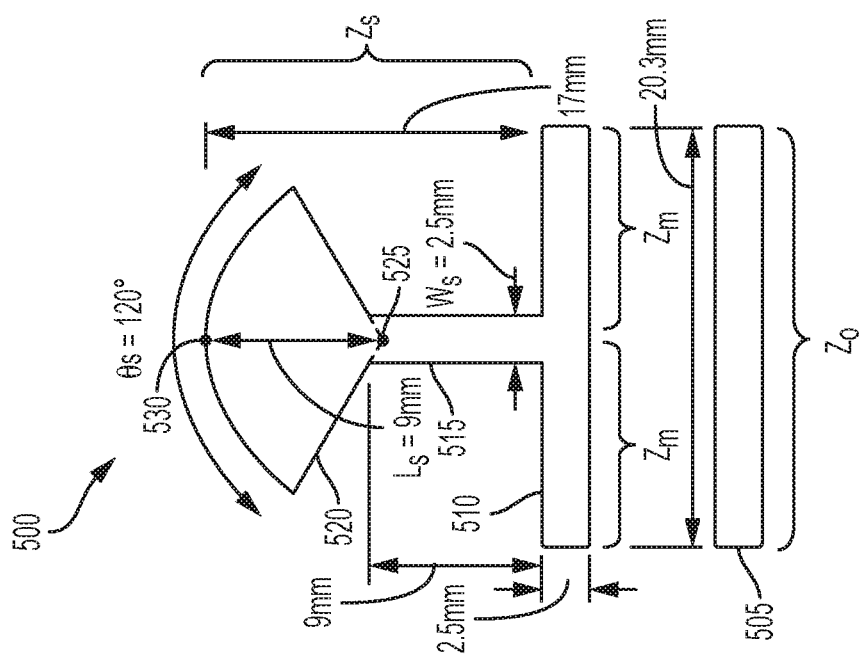
FIG. 5 illustrates an example of a passive phase shifter having a half-wavelength transmission line loaded with a quarter wavelength rectangular stub in series with a quarter wavelength radial stub structure, according to the disclosed embodiments.

FIG. 5 illustrates an example of an exemplary phase shifter 500 according to the disclosed embodiments. FIG. 5 shows a microstrip implementation that includes a reference line 505, and a half-wavelength transmission line 510. In this embodiment, the half-wavelength transmission line 510 is loaded with a quarter wavelength rectangular stub 515 in series with a quarter wavelength radial stub structure 520. The quarter wavelength radial stub structure 520 creates a wider bandwidth performance by slowing the change of electrical length as a function of frequency. The dimensions of the radial stub structure 520 may be determined by the following parameters:

$L_s$, the "height" of the radial stub structure 520, also referred to as the distance from a proximate apex 525 (FIG. 5B) of the radial stub structure 520 to a distal end 530 of the radial stub structure 520, may be specified as approximately a quarter wavelength in the disclosed embodiments;

$\theta_s$, the angle between the linear sides 545, 550 of the radial stub structure 520, may be specified in degrees or radians with larger angles providing wider bandwidth performance; and $W_s$, the width of a proximate end of the radial stub structure 520, and the width of the rectangular stub 515, may be calculated as a function of a dielectric constant of a substrate on which the radial stub structure 520 is formed, a height of the substrate, a thickness of a conductor material forming the radial stub structure, a frequency of operation, and a tuned characteristic impedance of the combination rectangular and radial stub structure, $Z_s$.

As shown in FIG. 5, exemplary parameters for the radial stub structure 520 for operations at approximately 5 GHz with an impedance $Z_s$ of the quarter wavelength rectangular stub 515 in series with the quarter wavelength radial stub structure 520 of approximately 34 ohms, include a distance $L_s$ of approximately 9 mm, a first angle $\theta_s$ of approximately 120 degrees, and a width $W_s$ of approximately 2.5 mm. The quarter wavelength rectangular stub 515 may have exemplary dimensions of an approximate width of 2.5 mm and a length of approximately 9 mm. The quarter wavelength rectangular stub 515 in series with the quarter wavelength radial stub structure 520 may have an exemplary length of approximately 17 mm. The half-wavelength transmission line 510 may have exemplary dimensions of a width of approximately 2.5 mm and an approximate length of 20.3 mm.

Figure 6:
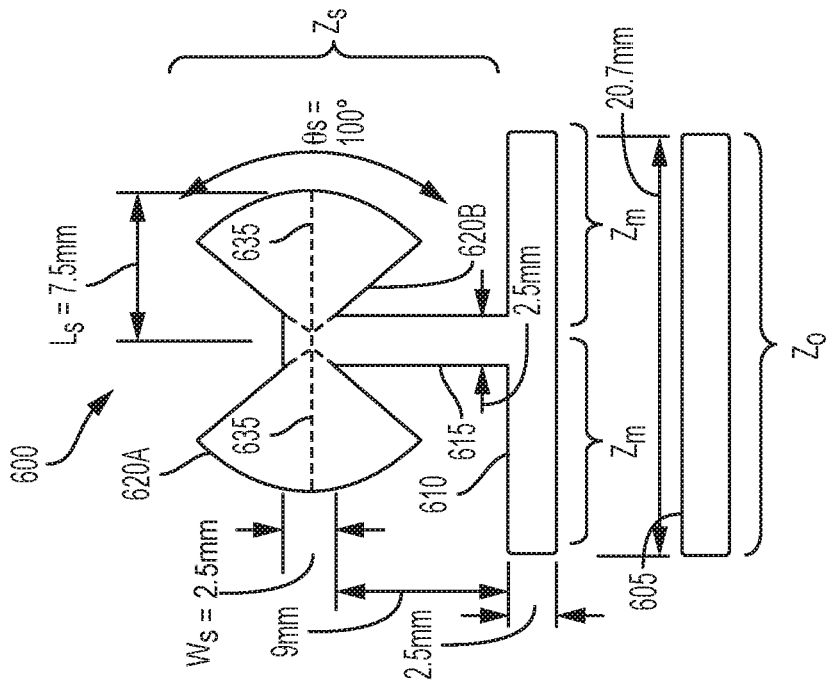
FIG. 6 shows an example of a passive phase shifter with a half-wavelength transmission line loaded with a quarter wavelength rectangular stub in series with a quarter wavelength radial stub structure comprising two opposing parallel radial stub elements, according to the disclosed embodiments.

FIG. 6 illustrates another embodiment of a microstrip phase shifter 600 having a reference line 605, and a half-wavelength transmission line 610. In this embodiment, the half-wavelength transmission line 610 is loaded with a quarter wavelength rectangular stub 615 in series with a radial stub structure having two parallel radial stub elements 620A, 620B arranged on opposing sides of the quarter wavelength rectangular stub 615, with centerlines 635 that extend parallel to the length of the half-wavelength transmission line 610. The two parallel radial stub elements 620A, 620B provide a phase shift over a wider bandwidth than the quarter wavelength radial stub structure 520 of FIG. 5 due to their proximity to the half-wavelength transmission line 610 and their increased area.

As shown in FIG. 6, exemplary parameters for the radial stub elements 620A, 620B for operations at approximately 5 GHz with an impedance $Z_s$ of the quarter wavelength rectangular stub 615 in series with the quarter wavelength radial stub elements 620A, 620B of approximately 34 ohms, include a distance $L_s$ of approximately 7.5 mm, a second angle $\theta_s$ of approximately 100 degrees for both 620A, 620B, and a width $W_s$ of approximately 2.5 mm. The quarter wavelength rectangular stub 615 may have a corresponding exemplary width of approximately 2.5 mm and a length of approximately 9 mm. The half-wavelength transmission line 610 may have an approximate width of 2.5 mm and an approximate length of 20.7 mm.

Figure 7:
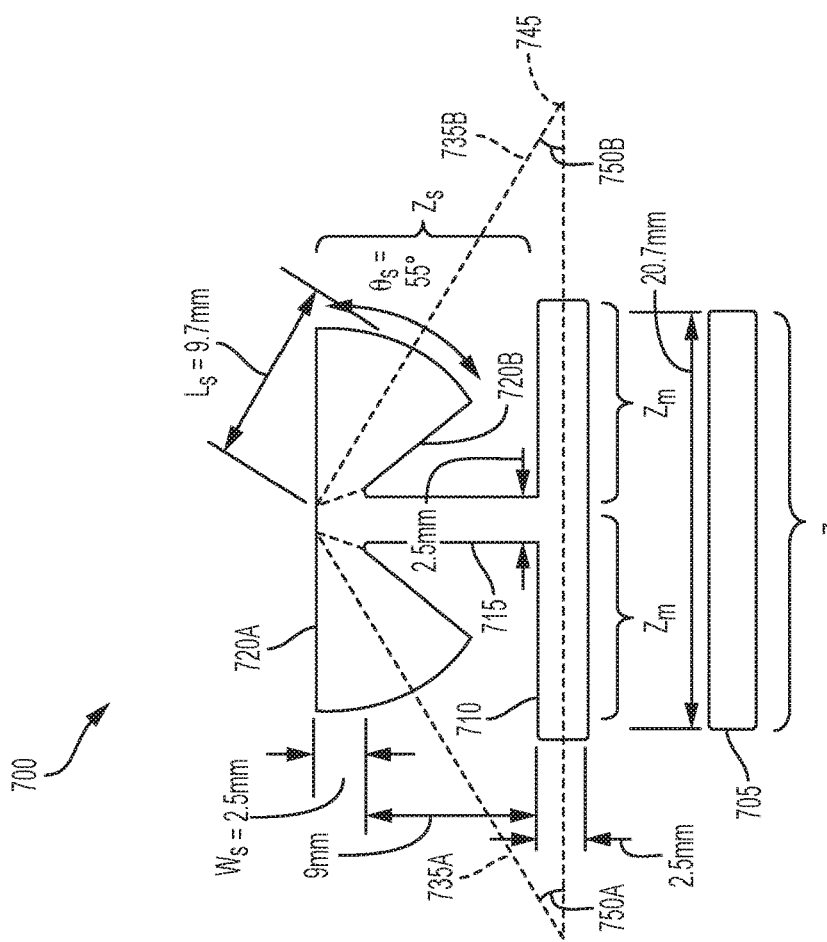
FIG. 7 depicts an exemplary embodiment of a passive phase shifter that includes a half-wavelength transmission line loaded with a quarter wavelength rectangular stub in series with a quarter wavelength radial stub structure comprising two opposing offset radial stub elements rotated around the rectangular stub, according to the disclosed embodiments.

FIG. 7 shows still another embodiment of a microstrip phase shifter 700 that includes a reference line 705, and a half-wavelength transmission line 710, where the half-wavelength transmission line 710 is loaded with a quarter wavelength rectangular stub 715 in series with a radial stub structure comprising two radial stub elements 720A, 720B. The two radial stub elements 720A, 720B are arranged on opposing sides of the quarter wavelength rectangular stub 715, with centerlines 735A, 735B that form opposite congruent acute third angles 750A, 750B with a centerline 745 of the transmission line 710. In this embodiment, the radial stub elements 720A, 720B have reduced arcuate dimensions relative to the radial stub elements 620A, 620B. This embodiment may be advantageous in accommodating a narrow channel width, that is, the distance occupied by Zs. For example, some embodiments may be limited to a width of approximately 150 mils or 3.81 mm.

As shown in FIG. 7, exemplary parameters for the radial stub elements 720A, 720B for operations at approximately 5 GHz with an impedance $Z_s$ of the quarter wavelength rectangular stub 715 in series with the quarter wavelength radial stub elements 720A, 720B of approximately 34 ohms, include a distance $L_s$ of approximately 9.7 mm, a fourth angle $\theta_s$ of approximately 55 degrees for both 720A and 720B, and a width $W_s$ of approximately 2.5 mm. The quarter wavelength rectangular stub 715 may have a corresponding width of approximately 2.5 mm and a length of approximately 9 mm. The half-wavelength transmission line 710 may have an approximate width of 2.5 mm and an approximate length of 20.7 mm.

Figure 8:
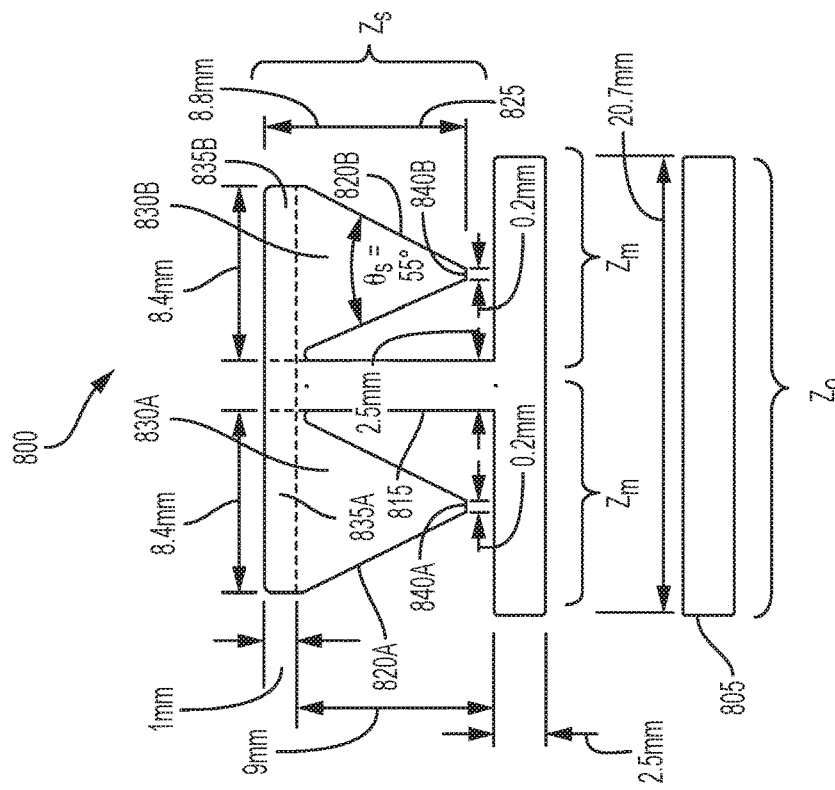
FIG. 8 illustrates yet another exemplary embodiment of a passive phase shifter that includes a half-wavelength transmission line loaded with a quarter wavelength rectangular stub in series with a quarter wavelength radial stub structure comprising two stub elements oriented perpendicular to a reference line.

FIG. 8 shows yet another embodiment of a phase shifter 800 that includes a reference line 805 and a loaded half-wavelength transmission line 810. In this embodiment, the half-wavelength transmission line 810 is loaded with a quarter wavelength rectangular stub 815 in series with a quarter wavelength radial stub structure comprising hexagonal radial stub elements 820A, 820B arranged on opposing sides of the quarter wavelength rectangular stub 815. The hexagonal stub elements 820A, 820B are constructed as isosceles frusto-triangular structures 830A, 830B with bases centered on respective rectangular shaped structures 835A, 835B and with height dimensions 825 extending perpendicular to the length of the transmission line 810. The apexes of the frusto-triangular structures 820A, 820B terminate in 0.2 mm flat surfaces 840A, 840B, parallel to the length of the transmission line 810.

As shown in FIG. 8, exemplary parameters for the hexagonal stub elements 820A, 820B for operations at approximately 5 GHz with an impedance $Z_s$ of the quarter wavelength rectangular stub 815 in series with the quarter wavelength radial stub elements 820A, 820B of approximately 34 ohms, include a distance $L_s$ of approximately 8.8 mm, an angle $\theta_s$ of approximately 55 degrees for both 820A and 820B, and a width $W_s$ of approximately 2.5 mm. The quarter wavelength rectangular stub 815 may have a corresponding width of approximately 2.5 mm and a length of approximately 9 mm. The rectangular shaped structures 835A, 835B each may have lengths of approximately 8.4 mm and widths of approximately 1 mm. The half-wavelength transmission line 810 may have an approximate width of 2.5 mm and an approximate length of 20.7 mm.

Figure 2:
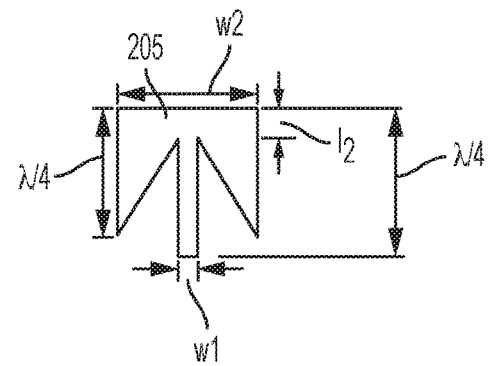
Figure 3:
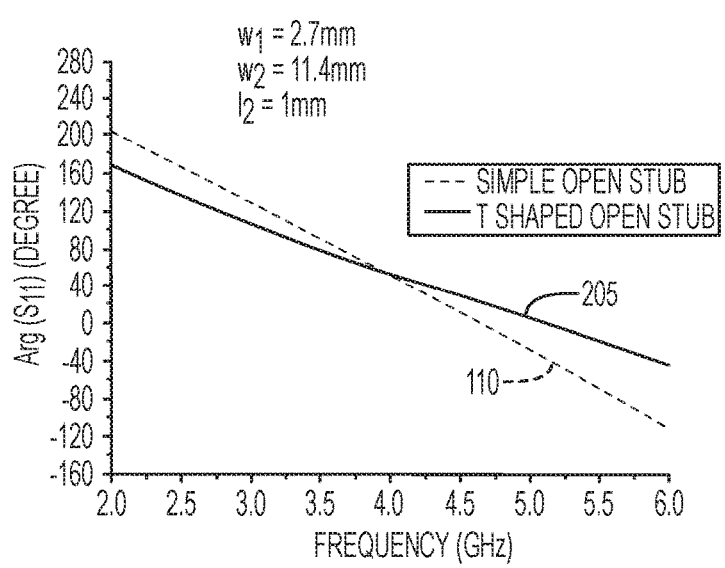
Figure 4:
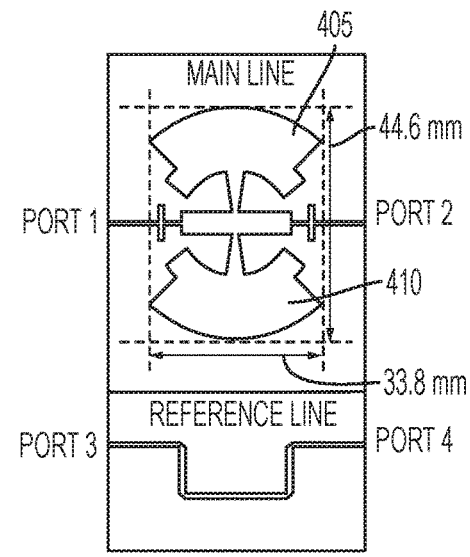
Figure 9:
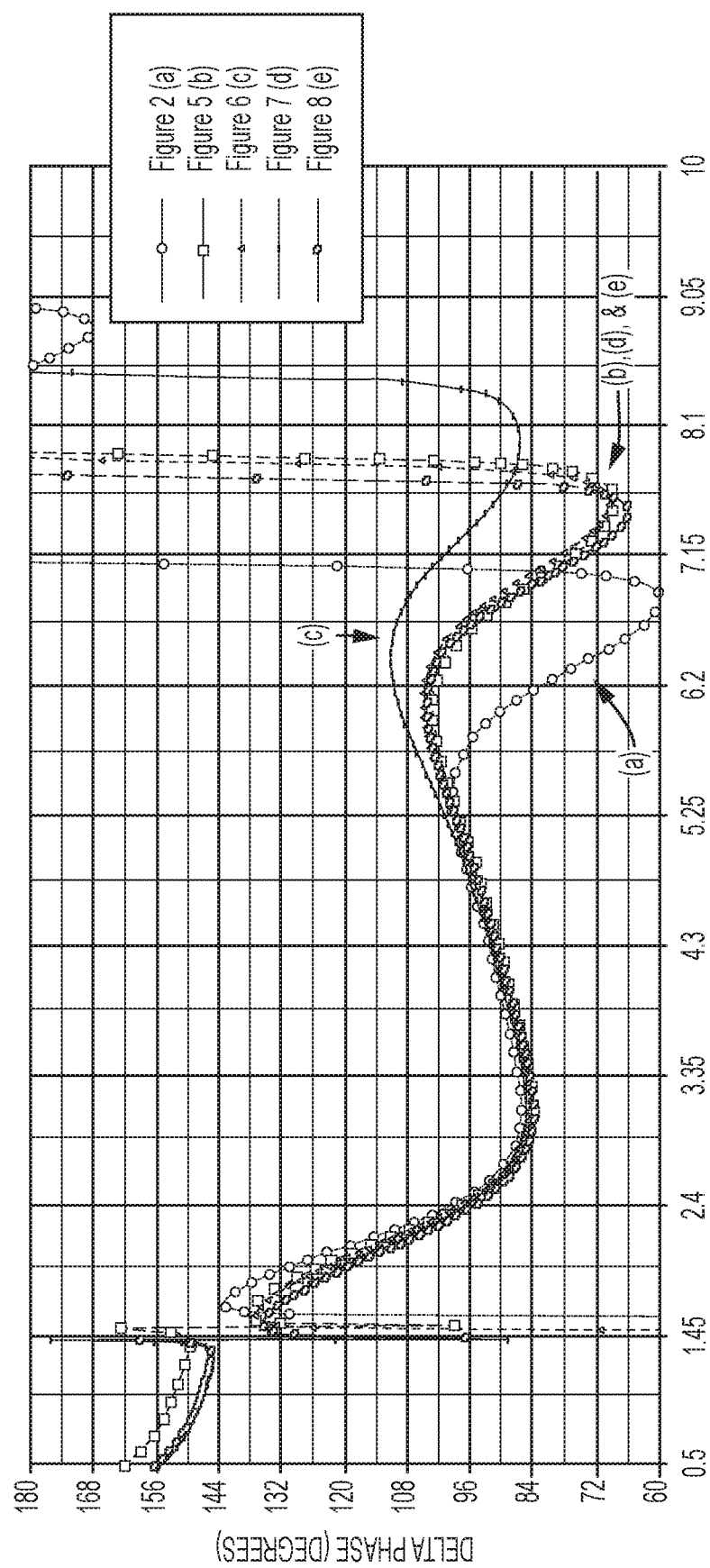
FIG. 9 shows relative performance characteristics of the disclosed embodiments in FIGS. 5A-8B as compared to the prior art design illustrated in FIG. 2.

FIG. 9 shows relative performance characteristics of the disclosed embodiments in FIGS. 5A-8B as compared to the performance of the prior art design illustrated in FIG. 2. The disclosed embodiments demonstrate an increased bandwidth performance over the prior art design, where the disclosed embodiments are able to maintain a phase shift of approximately 90 degrees±15 degrees, over a bandwidth extended by more than 27%, between 3-6 GHz, without making any changes to Zs, Zm, and Zo or by performing any optimizing for decreasing phase shift variations.

Figure 10A:
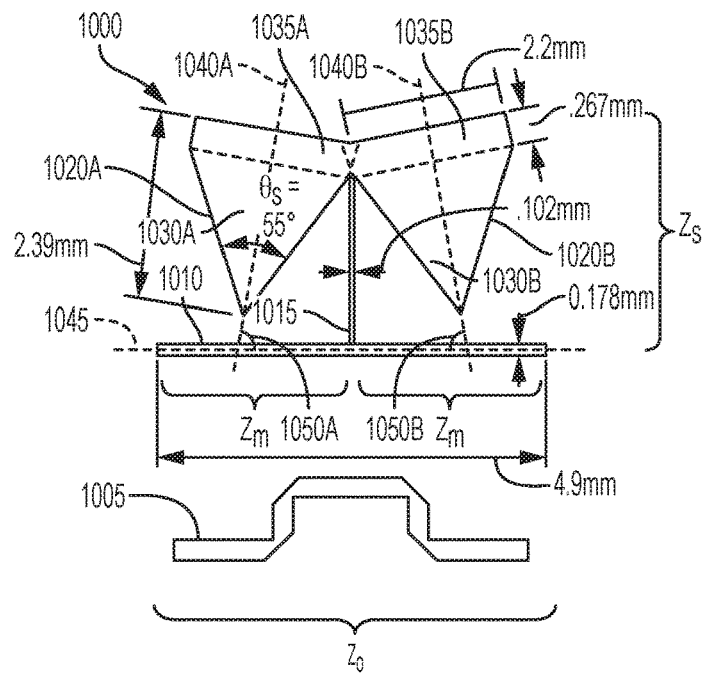
FIG. 10A illustrates an exemplary passive phase shifter utilizing a quarter wavelength radial stub structure comprising offset stub elements along with other geometry changes to optimize the phase shifter for narrower degrees of phase shift over wider ranges of operation, according to the disclosed embodiments.

FIG. 10A illustrates an exemplary phase shifter utilizing offset quarter wavelength radial stub elements along with other geometry changes to optimize the phase shifter for narrower degrees of phase shift over wider ranges of operation. For example, the illustrated phase shifter 1000 may be designed for 11.3 GHz to 16.8 GHz operation with 45±0.25 degrees of phase shift; and for 9 GHz to 18 GHz operation with 45±0.5 degrees of phase shift.

As shown in FIG. 10A, the phase shifter 1000 includes a reference line 1005 and a half-wavelength transmission line 1010 loaded with a quarter wavelength rectangular stub 1015 as in the other embodiments. However, this embodiment also includes two pentagonal radial stub elements 1020A, 1020B positioned on opposing sides of the quarter wavelength rectangular stub 1015. The quarter wavelength rectangular stub 1015 extends perpendicular to the half-wavelength transmission line 1010.

The pentagonal stub elements 1020A, 1020B are constructed as isosceles triangular shaped structures 1030A, 1030B with bases centered on respective rectangular structures 1035A, 1035B. Centerlines 1040A, 10408 of the two radial stub portions 1020A, 1020B form opposite congruent acute fifth angles 1050A, 1050B with a centerline 1045 of the transmission line 1010. The pentagonal stub elements 1020A, 1020B are positioned at the fifth angle to maintain a quarter wavelength and to ease fabrication by providing wider gaps between features.

According to FIG. 10A, exemplary parameters for the radial stub elements 1020A, 1020B for operations at approximately 13 GHz with an impedance $Z_s$ of the quarter wavelength rectangular stub 1015 in series with the quarter wavelength radial stub elements 1020A, 1020B of approximately 70 ohms, include a distance $L_s$ of approximately 2.39 mm, a sixth angle $\theta_s$ of approximately 55 degrees for both 1020A and 1020B, and a width $W_s$ of approximately 0.102 mm. The rectangular sections 1030A, 1030B each may have exemplary lengths of approximately 2.2 mm and widths of approximately 0.267 mm. The half-wavelength transmission line 1010 may have exemplary dimensions of an approximate width of 0.178 mm and an approximate length of 4.9 mm.

Figure 10B:
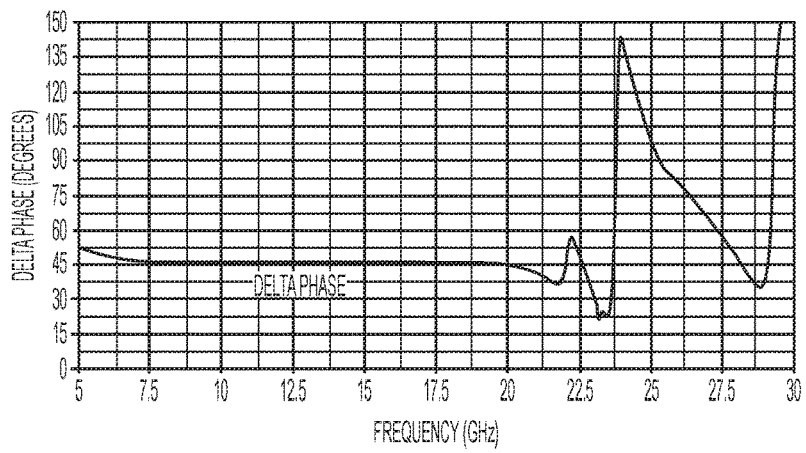
FIGS. 10B and 10C show the performance characteristics for the embodiment of FIG. 10.
Figure 10C:
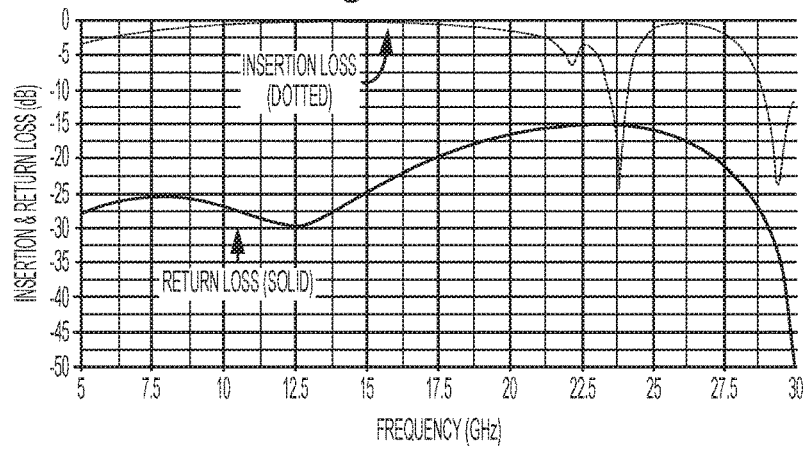

FIGS. 10B and 10C show the performance characteristics for the embodiment of FIG. 10A. As shown in FIG. 10B, the embodiment exhibits a 45 degree phase shift within ±0.5 degrees between 9 GHz and 18 GHz, and a 45 degree phase shift within ±0.25 degrees between 11.3 GHz and 16.8 GHz. As mentioned earlier, the ratio of Zs to Zm controls the phase variation. Decreasing the width of the rectangular stub 1015 results in an increase of the impedance Zs of the quarter wavelength rectangular stub 1015 in series with the quarter wavelength radial stub elements 1020A, 1020B with respect to the impedance Zm of the transmission line 1010, providing significantly less phase variation over a smaller bandwidth.

Referring to FIG. 100, the insertion loss of the embodiment of FIG. 10A is better than 1.1 dB and return loss is better than 7 dB from 8.4 GHz to 19.2 GHz.

While each of the disclosed phase shifters may be utilized in any number of linearization, amplification, frequency mixing, power dividing, power coupling, metrology, instrumentation, phase modulation communication system, and phased array antenna system applications, the embodiments shown in FIG. 10A may be particularly suited for use in a Ka band vector modulator.

It should be noted that although the structures shown in FIGS. 7, 8, and 10A may have more complicated features, the structures have equivalent microstrip models and can be easily tuned for other operating frequency and phase responses. It should also be noted that each of the disclosed embodiments are reciprocal networks, are electrically symmetrical, and are scalable to operate over a wide range of frequencies.

The disclosed embodiments thus provide various phase shifter embodiments with wide bandwidth performance and unique yet simple designs that are versatile and can be easily customized for other operating frequencies and phase shifts depending on the application. The designs have good return loss and low insertion loss performance, and a wider bandwidth performance can be obtained by trading off in-band phase ripple performance.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

The invention claimed is:

1. A passive phase shifter comprising:
a reference line; and
a half-wavelength transmission line, wherein the half-wavelength transmission line is loaded with a perpendicular quarter wavelength rectangular stub and a quarter wavelength radial stub structure connected in series, wherein the quarter wavelength radial stub structure comprises pentagonal radial stub elements arranged on opposing sides of the perpendicular quarter wavelength rectangular stub.

2. The passive phase shifter of claim 1, wherein the quarter wavelength rectangular stub is connected between the half wavelength transmission line and the quarter wavelength radial stub structure.

3. The passive phase shifter of claim 1, wherein the quarter wavelength radial stub structure comprises linear sides that define a first angle.

4. The passive phase shifter of claim 1, wherein the quarter wavelength radial stub structure comprises radial stub elements arranged on opposing sides of the perpendicular quarter wavelength rectangular stub.

5. The passive phase shifter of claim 4, wherein the radial stub elements have centerlines extending parallel to the half-wavelength transmission line.

6. The passive phase shifter of claim 4, wherein the radial stub elements comprise linear sides that define a second angle.

7. The passive phase shifter of claim 4, wherein the radial stub elements have centerlines that form opposite congruent acute third angles with a centerline of the transmission line.

8. The passive phase shifter of claim 4, wherein the radial stub elements comprise linear sides that define a fourth angle.

9. The passive phase shifter of claim 1, wherein the quarter wavelength radial stub structure comprises hexagonal radial stub elements arranged on opposing sides of the perpendicular quarter wavelength rectangular stub.

10. The passive phase shifter of claim 9, wherein the hexagonal radial stub elements arranged on opposing sides of the perpendicular quarter wavelength rectangular stub have height dimensions extending perpendicular to a length of the half-wavelength transmission line.

11. The passive phase shifter of claim 9, wherein the hexagonal radial stub elements comprise isosceles frusto-triangular structures with bases centered on rectangular shaped structures.

12. The passive phase shifter of claim 11, wherein apexes of the frusto-triangular structures terminate in flat surfaces parallel to a length of the half-wavelength transmission line.

13. The passive phase shifter of claim 1, wherein the pentagonal radial stub elements have centerlines that form opposite congruent acute fifth angles with a centerline of the transmission line.

14. The passive phase shifter of claim 1, wherein the pentagonal radial stub elements comprise linear sides that define a sixth angle.

15. The passive phase shifter of claim 1, wherein the pentagonal radial stub elements comprise isosceles triangular shaped structures with bases centered on rectangular shaped structures.

* * * * *